United States Patent [19]

Washo

[11] Patent Number: 5,003,222
[45] Date of Patent: Mar. 26, 1991

[54] CONNECTOR FOR ELECTROLUMINESCENT DISPLAY PANEL

[75] Inventor: Junichi Washo, Yamatokoriyama, Japan

[73] Assignee: Sharp Kabushiki Kaisha, Osaka, Japan

[21] Appl. No.: 453,223

[22] Filed: Dec. 21, 1989

Related U.S. Application Data

[63] Continuation of Ser. No. 266,325, Oct. 31, 1988, abandoned, which is a continuation of Ser. No. 685,212, Dec. 26, 1984, abandoned, which is a continuation of Ser. No. 405,246, Aug. 4, 1982, abandoned.

[30] Foreign Application Priority Data

Aug. 27, 1981 [JP] Japan ................................ 56-135254

[51] Int. Cl.⁵ ............................................ H05B 33/06
[52] U.S. Cl. .................................... 313/511; 313/512; 313/51; 313/505
[58] Field of Search ................ 313/51, 511, 512, 505, 313/583; 361/408

[56] References Cited

U.S. PATENT DOCUMENTS

| 3,366,836 | 1/1968 | Harvey | 313/505 X |
|---|---|---|---|
| 3,430,088 | 2/1969 | Beswick | 313/512 |
| 4,066,925 | 1/1978 | Dickson | 313/511 X |
| 4,113,981 | 9/1978 | Fujita et al. | 174/88 R |
| 4,731,503 | 3/1988 | Kitanishi | 313/51 X |

FOREIGN PATENT DOCUMENTS 2831984 2/1979 Fed. Rep. of Germany .... 174/88 R

Primary Examiner—Palmer C. DeMeo
Attorney, Agent, or Firm—Birch, Stewart, Kolasch & Birch

[57] ABSTRACT

An electroluminescent (EL) display panel comprising a flexible substrate film for supporting an EL display unit, a lead electrode provided on an extended portion of the flexible substrate film, the lead electrode leading out of the EL display unit, an adhesive provided on the lead electrode formed on the flexible substrate film, and a wiring board for carrying a driving circuit for the EL display unit, the wiring board being connected to the EL display unit by the adhesive. The EL display unit is a thin-film type or a powder type.

11 Claims, 1 Drawing Sheet

CONNECTOR FOR ELECTROLUMINESCENT DISPLAY PANEL

This application is a continuation of application Ser. No. 07/266,325 filed on Oct. 31, 1988, which is a continuation of application Ser. No. 06/685,212 filed Dec. 26, 1984, which is a continuation of application Ser. No. 405,246 filed Aug. 4, 1982, all now abandoned.

BACKGROUND OF THE INVENTION

The present invention relates to an electroluminescent (referred to as "EL" hereinbelow) display and, more particularly, a connector for an EL display panel and a driver.

Conventionally, leading connectors for electrodes of an EL display panel are provided with an etched plate which is made of Cu and is plated with Sn or Ni, a ribbon plate, or a mesh plate. The connector is soldered to a substrate for carrying a driving circuit. When the number of the leading connectors to be connected increases in the case where leading terminals of display digits are connected, the conventional leading connectors resulted in the difficulty of achieving an automatic manufacturing processing and speed up so as to thereby provide low productivity.

Wiring substrates for the leading connectors comprise a flexible substrate which is a film made of a polyimide etc. laminated with a Cu foil, or an Al foil. The flexible substrate is etched and plated to provide a wiring pattern. The etching and plating process is rather complicated. Further, it is difficult to treat the waste solution and assure a safe working environment.

SUMMARY OF THE INVENTION

Accordingly, it is an object of the present invention to provide an improved connector adapted for the interconnection of an EL display and its driving circuit.

It is another object of the present invention to provide an improved structure of an EL display unit in which a flexible connector and a printed wiring board are bonded with an adhesive.

Briefly described, in accordance with the present invention, an electroluminescent (EL) display panel comprises a flexible substrate film for supporting an EL display unit, a lead electrode provided on an extended portion of the flexible substrate film, the lead electrode leading out of the EL display unit, an adhesive provided on the lead electrode formed on the flexible substrate film, and a wiring board for carrying a driver for the EL display unit, the wiring board being connected to the EL display unit by the adhesive. The EL display unit is a thin-film type or a powder type.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE INVENTION

Figure 1:
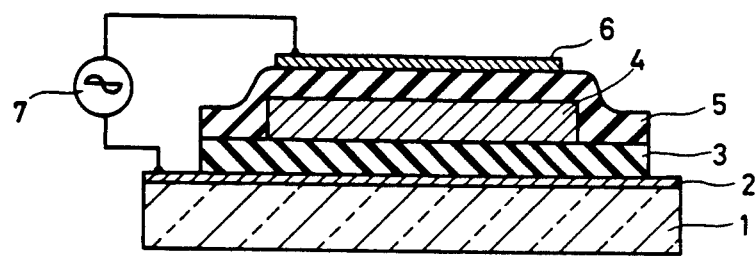
FIG. 1 shows a cross sectional view of a conventional thin-film EL display panel.

Firstly, a conventional thin-film electroluminescent (EL) display panel is illustrated in FIG. 1, wherein the EL display panel comprises a first transparent glass substrate 1, a transparent electrode 2 made of $In_2O_3$, $SnO_2$ etc. formed thereon, a first dielectric layer 3 made of $Y_2O_3$, $TiO_2$, $Si_3N_4$, $SiO_2$, etc., and EL thin film 4 made of ZnS:Mn, and a second dielectric layer 5 made of a similar material of the first dielectric layer 3. A counter electrode 6 is made of Al and is formed on the second dielectric layer 5 through evaporation techniques. The first dielectric layer 3 is provided by sputtering or electron beam evaporation techniques. The EL thin film 4 is made of a ZnS thin film doped with manganese at a desired amount. An AC electric field from an AC power source 7 is applied to the transparent electrode 2 and the counter electrode 6 to activate the EL thin film 4.

Figure 2:
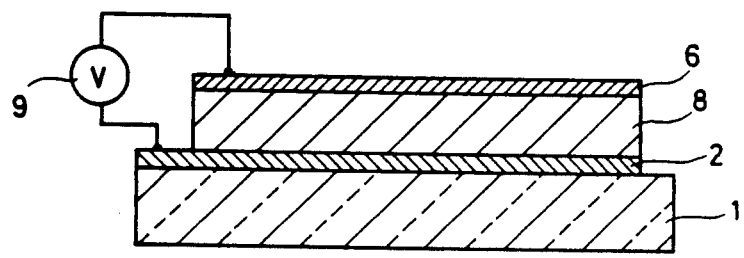
FIG 2 shows a cross sectional view of a conventional powder type EL display panel.

The EL thin film 4 is fabricated by electron beam evaporating a ZnS sintered pellet doped with Mn at a preferable quantity and, then, by heat-treating it in a vacuum or an inert gas atmosphere. Mn serves as a luminescent center in the EL thin film 4. Mn can be replaced by F of the rare earth elements. FIG. 2 shows a conventional powder type EL display panel. This display panel comprises a transparent glass substrate 1, a transparent electrode 2 thereon, a powder type EL layer 8, a counter electrode 6, and an AC power source 9.

The EL layer 8 comprises a synthetic resin and EL phosphor powder dispersed therein. The synthetic resin is styrene, an acrylic resin, or the like which has a small dielectric loss with a large dielectric constant. The EL phosphor powder is made of ZnSe, or a sulfide including ZnS, CdS, SrS or the like with small additions of at least one of the transition elements (Mn, Cr or the like) or rare earth elements (Eu, Sm or the like) as active elements. The AC power source 9 is provided for exicting the luminescent center in the EL layer 8.

Figure 3:
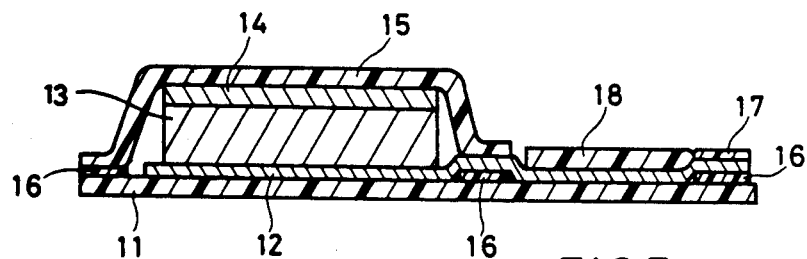
FIG. 3 shows a cross sectional view of a structure of an EL display panel in which a connector according to a specific form of the present invention is provided.
Figure 4:
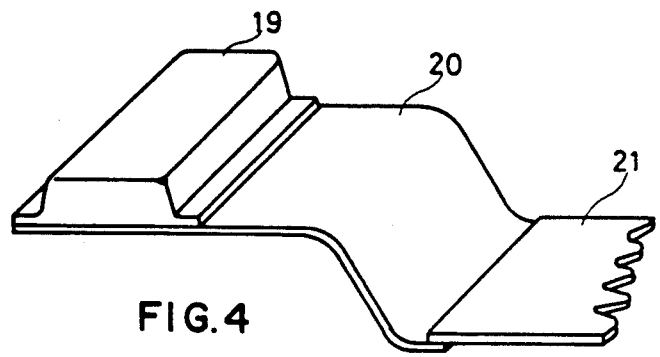
FIG. 4 shows a perspective view of the EL display panel of FIG. 3.

FIG. 3 shows a specific example of an EL display panel according to the present invention. FIG. 4 shows a perspective view of the EL display panel of FIG. 3

The specific example of the EL display panel as shown in FIG. 3 is embodied using the powder type EL display panel as shown in FIG. 2. It may be possible that the thin-film EL display panel as shown in FIG. 1 is applied to the present invention.

The EL display panel of FIG. 3 comprises a flexible substrate film 11, a transparent electrode 12, an EL layer 13, a counter electrode 14, a rear film 15, an adhesive addition 16, a conductive adhesive 17, an insulating adhesive 18.

The flexible substrate film 11 provides a display surface for passing the electroluminescence generated from the EL layer 13. The counter electrode 14 is disposed on the EL layer 13 to provide an EL display unit.

The rear film 15 covers the EL display unit. The end of the rear film 15 is adhered to the substrate film 11. The ends of the substrate film 11 and the transparent electrode 12 are extended to be connected to a driver circuit for the EL display unit. The adhesive addition 16, the conductive adhesive 17 and the insulating adhesive 18 are layered at the extended portions of the film 11 and the electrode 12.

As FIG. 4 shows, the EL display panel comprises the EL display unit 19, a flexible connector 20, and a printed wiring board 21 for supporting the driver of the EL display unit. The flexible connector 20 is interposed between the EL display unit 19 and the printed wiring board 21, covering the adhesives 16, 17 and 18.

The counter electrode 14 of FIG. 3 is connected to the printed wiring board 21 through the leads at the extended portions of the substrate film 11.

The substrate film 11 is composed of a heat-flexible material such as a thermoplastic resin including vinyl chloride or the like, a base film made of a saturated polyester resin or the like, the base film being coated with a thermoplastic resin using an adhesive addition. The rear film 15 is adhered to the substrate film 11 to seal the EL display unit 19. The printed wiring board 21 is connected to the extended portion of the substrate film 11.

The electrical and mechanical adhesion of the EL display unit 19 and the printed wiring board 21, and the sealing of the EL display unit 19 are accomplished in the following manner.

The surface of the substrate film 11 is unsaturated for activation by coating the adhesive addition 16 on the substrate film 11 by spraying or dipping.

The adhesive addition 16 is a thermoplastic resin. The conductive adhesive 17 is disposed on the extended electrode 12 over the treated surface of the substrate film 11 using a screen printing method. The insulating adhesive 18 is disposed on the exposed surface of the transparent electrode 12 and unnecessary portions of the lead terminals. Each of the conductive adhesive 17 and the insulating adhesive 18 is composed of a thermoplastic resin or a copolymer of a thermoplastic resin and a thermosetting resin. Each of them is adhered using heat, ultrasonic waves, high frequency waves, infrared waves, external stress or the like. The flexible connector 20 is provided for covering the adhesives 17 and 18.

Figure 5:
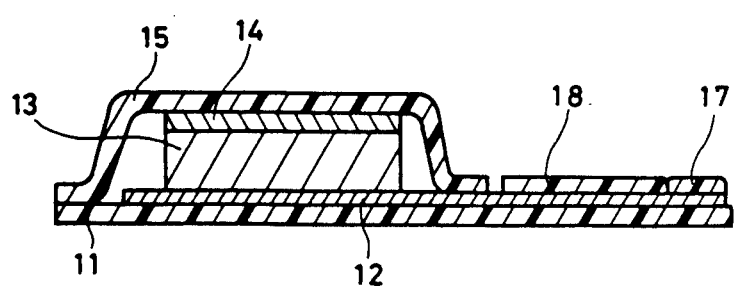
FIG. 5 shows a cross sectional view of a structure of another EL display panel according to another specific form of the present invention.

FIG. 5 shows another specific form of the EL display panel according to the present invention. Like elements corresponding to those of FIG. 3 are indicated by like numerals.

In this preferred embodiment, the provision of the adhesive addition 16 is omitted. The substrate film 11 is composed of a thermoplastic resin or a copolymer of a thermoplastic resin and a thermosetting resin. The substrate film 11 is subjected to the corona discharge or the sandblast treatment to make its surface uneven and to enable a mechanical and an electrical connection.

According to the present invention, the EL display unit and the printed wiring board are fixed to the flexible substrate film. The lead terminal for interconnecting the EL display unit and the wiring board is formed on the flexible substrate film.

The sealing of the EL display unit and the combination of the EL display unit and the printed wiring board are accomplished at the same time to thereby reduce the working process. Due to the provision of the flexible substrate film, the shape of the EL display unit including the driver can be freely selected to enhance its application such as computer output devices, numerical displays for timepieces or the like, and displays for characters, signs, symbols, pictures or the like.

The flexible connector is easily detachable from the printed wiring board because it is adhered only by the adhesive, so that the part can be exchanged. The driver to be connected to the EL display can be freely exchanged to select the operation of the EL display unit.

While only certain embodiments of the present invention have been described, it will be apparent to those skilled in the art that various changes and modifications may be made therein without departing from the spirit and scope of the invention as claimed.

What is claimed is:

1. An electroluminescent display panel comprising
   an EL display unit including an EL layer, a transparent electrode disposed on a front side of the EL layer and a counter electrode disposed on a rear side thereof,
   a flexible substrate on which said display unit is disposed for passing electroluminescence generated from said EL layer,
   a driving circuit for said EL display unit with extended portions of said flexible substrate and said transparent electrode, the latter overlying the former, being connected with said driven circuit for said EL display unit.
   a rear film covering said EL display unit, adhered to said flexible substrate to seal said EL display unit thereto,
   a first adhesive disposed as a layer on said extended portion of said transparent electrode for connection with said driving circuit, said first adhesive comprising an insulating adhesive and a conductive adhesive, and
   a second adhesive provided between said transparent electrode and said flexible substrate on the driving circuit end of said display panel and between said rear film and said flexible substrate on the display unit end of said display panel,
   wherein said flexible substrate and said respective first and second adhesives are composed of a thermoplastic resin or a copolymer of a thermoplastic resin and a thermosetting resin.

2. The display panel of claim 1, wherein said conductive adhesive portion of said first adhesive is formed on an exposed surface of said extended transparent electrode connected to said driving circuit and said insulating adhesive portion of said first adhesive if formed on said exposed surface of said extended transparent electrode, remote from and not directly connected to said driving circuit between said conductive adhesive portion and said display unit.

3. An electroluminescent (EL) display device comprising:
   a flexible and transparent substrate extending in a longitudinal direction;
   a flexible and transparent conductive layer formed on said substrate, extending in said longitudinal direction and including a transparent electrode portion at one end portion of said substrate, a terminal portion at the other end portion of said substrate and a cable lead portion between said transparent electrode portion and said terminal portion;
   an EL layer formed on said transparent electrode portion;
   a counter electrode formed on said EL layer;
   a driving circuit board with terminals attached to said terminal portion of said conductive layer by a first adhesive; and
   a flexible, insulating adhesive layer on said cable lead portion of said conductive layer.

4. A display device according to claim 3, further comprising a rear film formed on said counter electrode so as to seal said counter electrode, said EL layer and said transparent electrode portion of said conductive layer together with said substrate.

5. A display device according to claim 4, further comprising a second adhesive for attaching said rear film to said substrate.

6. A display device according to claim 5, wherein said second adhesive is composed of a thermoplastic resin or a copolymer of a thermoplastic resin and a thermosetting resin.

7. A display device according to claim 3, further comprising a third adhesive disposed between said transparent conductive layer and said substrate.

8. A display device according to claim 7, wherein said third adhesive is composed of a thermoplastic resin or a copolymer of a thermoplastic resin and a thermosetting resin.

9. A display device according to claim 3, wherein said first adhesive and said insulating adhesive layer are composed of a thermoplastic resin or a copolymer of a thermoplastic resin and a thermosetting resin.

10. A display device according to claim 3, wherein said substrate is composed of a thermoplastic resin or a copolymer of a thermoplastic resin and a thermosetting resin.

11. A display device according to claim 3, wherein said first adhesive comprises a conductive portion and an insulating portion for selective connection between said terminal portion of said conductive layer and said terminals of said circuit board.

* * * * *